US011346899B2

(12) United States Patent
Zimmer et al.

(10) Patent No.: US 11,346,899 B2
(45) Date of Patent: May 31, 2022

(54) MAGNETORESISTIVE SENSOR WITH REDUCED STRESS SENSITIVITY

(71) Applicant: Infineon Technologies AG, Neubiberg (DE)

(72) Inventors: Juergen Zimmer, Neubiberg (DE); Klemens Pruegl, Regensburg (DE)

(73) Assignee: Infineon Technologies AG

( * ) Notice: Subject to any disclaimer, the term of this patent is extended or adjusted under 35 U.S.C. 154(b) by 185 days.

(21) Appl. No.: 16/028,738

(22) Filed: Jul. 6, 2018

(65) Prior Publication Data
US 2020/0011943 A1   Jan. 9, 2020

(51) Int. Cl.
*G01R 33/09* (2006.01)
*H01L 43/10* (2006.01)
*B82Y 25/00* (2011.01)

(52) U.S. Cl.
CPC ......... *G01R 33/093* (2013.01); *G01R 33/098* (2013.01); *H01L 43/10* (2013.01); *B82Y 25/00* (2013.01)

(58) Field of Classification Search
CPC .......................... G01R 33/093; G01R 33/098; G01R 33/0052; H01L 43/10; H01L 43/08; B82Y 25/00; H01F 10/3268; H01F 10/3272
See application file for complete search history.

(56) References Cited

U.S. PATENT DOCUMENTS

| 8,174,800 | B2 * | 5/2012 | Tsunekawa | B82Y 10/00 360/324.11 |
| 9,146,287 | B2 | 9/2015 | Zimmer et al. | |
| 2002/0085319 | A1 * | 7/2002 | Hayakawa | G11B 5/3909 360/324.2 |
| 2005/0280955 | A1 * | 12/2005 | Hasegawa | B82Y 25/00 360/324.11 |
| 2008/0008908 | A1 * | 1/2008 | Ishiwata | B82Y 25/00 428/811 |
| 2009/0168264 | A1 * | 7/2009 | Hara | G01R 33/098 360/324 |
| 2013/0065075 | A1 * | 3/2013 | Pruegl | H01L 43/12 428/611 |

(Continued)

OTHER PUBLICATIONS

Hung, C.-Y., et al., "Magnetic Properties of Ultrathin NiFe and CoFe Films", Journal of Applied Physics, vol. 87, Issue 9, pp. 6618-6620 (2000).

(Continued)

*Primary Examiner* — Patrick Assouad
*Assistant Examiner* — Haidong Zhang
(74) *Attorney, Agent, or Firm* — Design IP

(57) ABSTRACT

A magnetoresistive sensor includes a first non-magnetic layer, a second non-magnetic layer, and a magnetic free bi-layer. The magnetic free bi-layer is disposed between first non-magnetic layer and the second non-magnetic layer, the magnetic free bi-layer including a first magnetic free layer coupled to a second magnetic free layer. The first magnetic free layer is coupled to the first non-magnetic layer, and the second magnetic free layer is coupled to the second non-magnetic layer. The second non-magnetic layer comprises a non-magnetic material having an atomic radius within 10% of an atomic radius of at least one of the first magnetic free layer and the second magnetic free layer.

17 Claims, 1 Drawing Sheet

(56) References Cited

U.S. PATENT DOCUMENTS

2013/0264534 A1* 10/2013 Hwang ................ H01L 45/146
257/2
2014/0376351 A1* 12/2014 Cheng ................... C22C 21/10
369/13.33

OTHER PUBLICATIONS

Hideaki Fukuzawa, et al., "Saturation Magnetostriction of an Ultrathin CoFe Free-layer on Double-layered Underlayers", Journal of Applied Physics 91, No. 5, 3120 (2002); https://doi.org/10.1063/1.1434551.
Emma Kerr, Sebastiaan van Dijken, and J. M. D. Coey. "Influence of the annealing field strength on exchange bias anti magnetoresistance of spin valves with IrMn." Journal of Applied Physics. 97, 093910 (2005). DOI: 10.1063/1.1895474.

\* cited by examiner

MAGNETORESISTIVE SENSOR WITH REDUCED STRESS SENSITIVITY

FIELD

The present disclosure relates generally to a magnetoresistive sensor device and to methods for manufacturing the same, and, more particularly, to a magnetoresistive sensor device with reduced stress sensitivity.

BACKGROUND

Magnetoresistive effects are based on numerous different physical phenomena. All of these phenomena have in common that an electrical resistance of a resistive element is alterable by a magnetic field penetrating the resistive element. Technologies utilizing magneto-resistive effects are sometimes referred to as "xMR technologies", whereby the "x" indicates that a multitude of effects may be addressed here, like the Giant Magneto-Resistive (GMR) effect, the Tunnel Magneto-Resistive (TMR) effect, or the Anisotropic Magneto-Resistive (AMR) effect, to mention just a few examples. xMR effects may be applied in a variety of field-based magnetoresistive sensors, for example, for measuring revolution, angles, etc.

xMR sensors, and in particular xMR angle sensors, should exhibit a sensor layer (free layer) being capable of ideally following the direction of an external rotating magnetic field. Nevertheless, in reality there may be internal magnetic forces (e.g., magnetic anisotropies) competing with the external magnetic field leading to a deviation between the free layer magnetization and the external field direction. As a result, the xMR sensor may output an incorrect value due to this angle error caused by the deviation. Ferromagnetic materials may exhibit a magnetostrictive effect, i.e. upon an external magnetic field a geometric dimension changes. The inverse effect is the so-called magnetoelastic effect, i.e. a change of a geometric dimension leads to the generation of a magnetic anisotropy axis.

Furthermore, the xMR sensor stack might exhibit a so-called magnetoelastic behavior, i.e., upon applied mechanical stress/strain to the sensor chip an additional magnetic anisotropy axis may be introduced leading to an additional angle error. Mechanical stress/strain can occur to the sensor chip by the packaging process, over temperature within the package, and/or over a lifetime of the device. Thus, the magnetic sensor properties might change over temperature and/or lifetime which is undesirable.

Thus, reducing the magnetoelastic behavior of xMR stacks to improve the sensor performance may be desired.

SUMMARY

Embodiments provide a magnetoresistive sensor device with reduced stress sensitivity.

According to an embodiment, a magnetoresistive sensor includes a first non-magnetic layer, a second non-magnetic layer, and a magnetic free bi-layer. The magnetic free bi-layer is disposed between first non-magnetic layer and the second non-magnetic layer, the magnetic free bi-layer including a first magnetic free layer coupled to a second magnetic free layer. The first magnetic free layer is coupled to the first non-magnetic layer, and the second magnetic free layer is coupled to the second non-magnetic layer. The second non-magnetic layer comprises a non-magnetic material having an atomic radius within 10% of an atomic radius of at least one of the first magnetic free layer and the second magnetic free layer.

According to another embodiment, a magnetoresistive sensor includes, a seed layer, a cap layer, and a magnetic layer stack disposed between the seed layer and the cap layer. The magnetic layer stack includes a first non-magnetic layer, a second non-magnetic layer, and a magnetic free bi-layer disposed between first non-magnetic layer and the second non-magnetic layer. The magnetic free bi-layer includes a first magnetic free layer coupled to a second magnetic free layer, where the first magnetic free layer is coupled to the first non-magnetic layer, and the second magnetic free layer is coupled to the second non-magnetic layer. The second non-magnetic layer is disposed between the magnetic free bi-layer and one of the seed layer and the cap layer. In addition, the second non-magnetic layer includes a non-magnetic material having an atomic radius between an atomic radius of the second magnetic free layer and an atomic radius of at least one of the seed layer and the cap layer.

BRIEF DESCRIPTION OF THE DRAWINGS

Embodiments are described herein making reference to the appended drawings.

DETAILED DESCRIPTION

Figure 1:
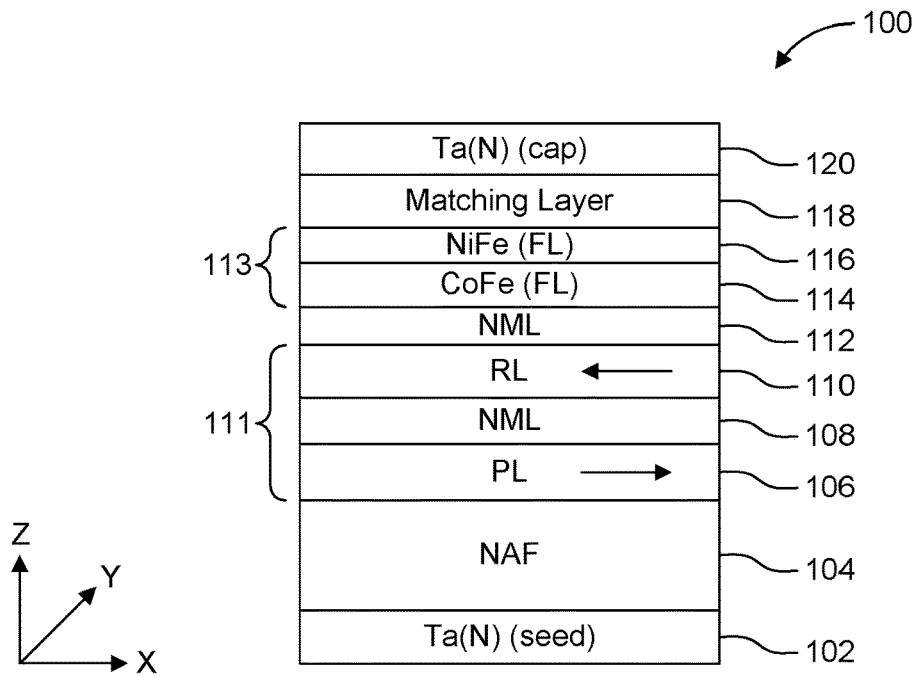
FIG. 1 shows a vertical cross-section of a GMR stack according to one or more embodiments.

In the following, various embodiments will be described in detail referring to the attached drawings. These embodiments are given for illustrative purposes only and are not to be construed as limiting. For example, while embodiments may be described as comprising a plurality of features or elements, in other embodiments, some of these features or elements may be omitted, and/or may be replaced by alternative features or elements. In other embodiments, further features or elements in addition to those explicitly shown or described may be provided. In addition, features of the different embodiments described hereinafter may be combined with each other to form further embodiments, unless specifically noted otherwise. For example, variations or modifications described with respect to one of the embodiments may also be applicable to other embodiments unless noted to the contrary.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Whenever a singular form such as "a," "an," and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes," and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. Functional blocks may be implemented in hardware, firmware, software, or a combination thereof.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be a an angle sensor, a linear position sensor, a speed sensor, motion sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

It will be appreciated that the terms "sensor" and "sensing element" may be used interchangeably throughout this description, and the terms "sensor signal" and "measurement signal" may also be used interchangeably throughout this description.

Magnetic sensors, as provided herein, may be magnetoresistive sensors. Magnetoresistance is a property of a material to change the value of its electrical resistance when an external magnetic field is applied to it. Some examples of magnetoresistive effects are Giant Magneto-Resistance (GMR), which is a quantum mechanical magnetoresistance effect observed in thin-film structures composed of alternating ferromagnetic and non-magnetic conductive layers, Tunnel Magneto-Resistance (TMR), which is a magnetoresistive effect that occurs in a magnetic tunnel junction (MTJ), which is a component consisting of two ferromagnets separated by a thin insulator, or Anisotropic Magneto-Resistance (AMR), which is a property of a material in which a dependence of electrical resistance on the angle between the direction of electric current (i.e., sensing axis) and direction of magnetization is observed. For example, in the case of AMR sensors, a resistance for an AMR sensor element changes according to a square of a sine of an angle of the magnetic field component projected on a sensing axis the AMR sensor element.

The plurality of different magnetoresistive effects is commonly abbreviated as xMR, wherein the "x" acts as a placeholder for the various magnetoresistive effects. xMR sensors can detect the orientation of an applied magnetic field by measuring sine and cosine angle components with monolithically integrated magnetoresistive sensor elements.

Magnetoresistive sensor elements of such xMR sensors typically include a plurality of layers, of which at least one layer is a reference layer with a reference magnetization (i.e., a reference direction in the case of GMR or TMR technology). The reference magnetization is a magnetization direction that provides a sensing direction corresponding to a sensing axis of the xMR sensor. Accordingly, in the case for a GMR or a TMR sensor element, if a magnetic field component (e.g., a free layer) points exactly in the same direction as the reference direction, a resistance of the xMR sensor element is at a minimum, and, if a magnetic field component points exactly in the opposite direction as the reference direction, the resistance of the xMR sensor element is at a maximum. A magnetic field component may be, for example, an x-magnetic field component (Bx), a y-magnetic field component (By), or a z-magnetic field component (Bz), where the Bx and By field components are in-plane to the magnetic sensor, and Bz is out-of-plane to the magnetic sensor.

While the materials chosen for the free layer may be intrinsically (i.e. as bulk material) magnetostriction-free, as ultra-thin layers a magnetostrictive/magnetoelastic behavior may be induced in the free layer system. This effect depends on the material and thickness of the next neighbouring layer of the magnetic free layer as a consequence of lattice mismatch between the two layers (i.e., between the neighbor layer and the magnetic free layer). The magnetic free layer for an xMR sensor may be made from a nickel-iron (NiFe) alloy or a cobalt-iron (CoFe) alloy or a combination of both may be used in a bi-layer arrangement where two magnetic free layers are used. In particular, each magnetic free layer may be made of a material selected from cobalt, nickel, iron, and alloys thereof. Alloys may comprise non-ferromagnetic materials (e.g., carbon, boron, nitrogen, and/or oxygen) with ferromagnetic materials constituting at least 50% of a material composition of the respective layer. As used herein, a "bi-layer" refers to two adjacently disposed layers that make up a layer system.

A neighbor layer may constitute a neighbor layer system where a ruthenium (Ru)/copper (Cu) bi-layer next-neighbour layer system is disposed adjacent to one of the magnetic free layers. By varying the thickness ratio of Ru/Cu the magnetoelastic behavior can be changed.

For a sensor application, the thickness of non-magnetic but conductive layers should be as small as possible to prevent a too strong shunting reducing the signal ratio dR/R. Therefore, the Ru/Cu bi-layer system for adjusting the magnetoelastic behavior is not favorable for sensor applications.

According to one or more embodiments, an xMR layer stack, referred to as a magnetic layer stack, may include a magnetic free bi-layer disposed between two non-magnetic layers. The two non-magnetic layers adjacent to the magnetic free bi-layer may be referred to as neighbor layers. The magnetic free bi-layer includes two adjacently disposed magnetic free layers. One of the non-magnetic layers may be disposed between the magnetic free bi-layer and a cap layer or a seed layer in a bottom spin value (BSV) or a top spin valve (TSV) arrangement, respectively.

The cap layer may be made of tantalum (Ta) or tantalum-nitride (TaN), having an atomic radius of 200 pm. The seed layer may be made of a bi-layer of a Ta or TaN layer and a nickel-chromium (NiCr) layer, having an atomic radius of 166 pm.

Co(Fe) and Ni(Fe) have similar atomic radii (lattice constant) of 152 pm and 149 pm, respectively. A copper (Cu) layer, having an atomic radius of 145 pm, may be used as one neighbour layer, thereby not leading to a significant lattice mismatch with respect to the magnetic free layer(s). On the other hand, the Ta(N) layer or the NiCr layer on the other side of the free layers with an atomic radius of 200 pm or 166 pm leads to significant lattice mismatch with respect to the magnetic free layer(s), and, therefore, to a potential introduction of a magnetoelastic behavior. Thus, another non-magnetic layer, having an atomic radius more similar to the magnetic free layer(s), is used as the second neighbor layer. This second neighbor layer may also be referred to as a matching layer.

The matching layer between the seed/cap layer and the magnetic free bi-layer, having a lattice constant similar to that of the free layer(s) reduces the potential lattice mismatch. As an example, a thin Cu (atomic radius 145 pm) or magnesium Mg (atomic radius 145 pm) layer would be suitable. By this additional layer, the lattice mismatch of the free layer to the neighbouring layers is minimized. As a result, the stress/strain sensitivity is reduced.

Accordingly, the magnetic layer stack may include a first non-magnetic layer; a second non-magnetic layer (i.e., a matching layer); and a magnetic free bi-layer disposed between first non-magnetic layer and the second non-magnetic layer, the magnetic free bi-layer including a first magnetic free layer coupled to a second magnetic free layer. Here, the first magnetic free layer is coupled to the first non-magnetic layer, and the second magnetic free layer is coupled to the second non-magnetic layer.

In addition, in order to minimize the lattice mismatch, the second non-magnetic layer is made of a non-magnetic material having an atomic radius within 10% of an atomic radius of at least one of the first magnetic free layer and the second magnetic free layer. For example, if the second magnetic free layer is NiFe, having an atomic radius of 149 pm, the second non-magnetic layer should be made of a material that has an atomic radius within 14.9 pm from 149 pm (i.e., 134.1-163.9 pm). Thus, the non-magnetic material of the second non-magnetic layer may be selected, for example, from one of copper, magnesium, indium, bismuth, tin, and zinc. In addition, the non-magnetic material of the second non-magnetic layer may be selected to have an atomic radius within 5% of an atomic radius of at least one of the first magnetic free layer and the second magnetic free layer for further reduction of the lattice mismatch.

Similarly, the material of the first non-magnetic layer may also be selected to minimize the lattice mismatch between it and the first magnetic free layer. Here, the first non-magnetic layer may be made of a non-magnetic material having an atomic radius within 10% of an atomic radius of at least one of the first magnetic free layer and the second magnetic free layer. For example, if the first magnetic free layer is made of CoFe, having an atomic radius of 152 pm, the second non-magnetic layer should be made of a material that has an atomic radius within 15.2 pm from 152 pm (i.e., 136.8-167.2 pm). Thus, the non-magnetic material of the first non-magnetic layer may be selected from, for example, one of copper, magnesium, indium, bismuth, tin, and zinc. In addition, the non-magnetic material of the first non-magnetic layer may be selected to have an atomic radius within 5% of an atomic radius of at least one of the first magnetic free layer and the second magnetic free layer for further reduction of the lattice mismatch.

In the following, some example implementations of GMR structures are described. However, similar principles may be applied to other types of xMR sensors, such as TMR and the like. GMR structures are often operated in a so-called current-in-plane (CIP) configuration, i.e., the applied current flows in parallel to the layer structure or the chip top surface. The application spectrum for TMR structures is similar to GMR structures. However, compared to GMR structures, TMR structures are often operated in a so-called current-perpendicular-to-plane (CPP) configuration, i.e., the applied current flows perpendicular to the layer structure or the chip top surface.

FIG. 1 shows a vertical cross-section of a GMR stack according to one or more embodiments. Specifically, the GMR stack in FIG. 1 is arranged in a bottom spin valve (BSV) configuration.

FIG. 1 shows an example of a magnetic layer stack 100 of a magnetoresistive sensor according to an example. For instance, the magnetic layer stack 100 can be arranged on a semiconductor substrate (not shown) of the magnetoresistive sensor. If described in a Cartesian coordinate system with pair-wise perpendicular coordinate axes x, y, and z, the layers each extend laterally in a plane spanned by the x and y axes. Hereinabove, lateral dimensions (e.g., lateral distances, lateral cross sectional areas, lateral areas, lateral extensions, lateral displacements, etc.) refer to dimensions in the xy-plane. Vertical dimensions refer to dimensions in z-direction, perpendicular to the xy-plane. For example, the (vertical) extent of a layer in z-direction may be described as the layer thickness.

From the bottom up, the magnetic layer stack 100 comprises a seed layer 102 used to influence and/or optimize the stack growth. A natural antiferromagnetic (NAF) layer 104 is disposed on the seed layer 102 and a ferromagnetic pinned layer 106 is disposed on the NAF layer 104. The NAF layer 104 may be made of platinum-manganese (PtMn), iridium-manganese (IrMn), nickel-manganese (NiMn), or the like. A film thickness of the NAF can be in the range of 5 nm to 50 nm. The pinned layer (PL) 106 may be made of CoFe, cobalt-iron-boron (CoFeB), or the like.

Contact between the NAF layer 104 and the pinned layer 106 can provoke an effect known as exchange bias effect, causing the magnetization of the pinned layer 106 to align in a preferred direction (e.g., in the x-direction, as shown). The pinned layer 106 can comprise a closed flux magnetization pattern in the xy-plane. This closed flux magnetization pattern of the pinned layer 106 may be generated during manufacturing of the magnetic layer stack 100 and may be permanent. Alternatively, the pinned layer 106 can comprise a linear magnetization pattern in the xy-plane.

The magnetic layer stack 100 further comprises a non-magnetic layer (NML) referred to as coupling layer 108. The coupling layer 108 may be diamagnetic and comprise ruthenium, iridium, copper and/or copper alloys and similar materials, for example. The coupling layer 108 spatially separates the pinned layer 106 from the magnetic (e.g., ferromagnetic) reference layer (RL) 110. The coupling layer 108 can provide an antiferromagnetic Ruderman-Kittel-Kasuya-Yosida (RKKY) coupling to form an artificial antiferromagnet. Thus, using this build-up, the magnetization of the magnetic reference layer 110 may align and be held in a direction anti-parallel to the magnetization of the pinned layer 106 (i.e., in the −x-direction, as shown).

For example, if the pinned layer 106 comprises a clockwise closed flux magnetization pattern in the xy-plane, the magnetic reference layer 110 may comprise a counterclockwise closed flux magnetization pattern in the xy-plane (or vice versa). In this way, the magnetic reference layer 110 can have a permanent closed flux magnetization pattern. Moreover, in case the pinned layer 106 comprises a linear magnetization pattern in the xy-plane into a certain direction, the reference layer 110 may comprise a linear magnetization pattern in an anti-parallel direction. Thus, the pinned layer 106, the coupling layer 108, and the magnetic reference layer 110 forms a magnetic reference system 111. The film thickness for the pinned layer 106 and the reference layer 110, respectively, may be in the range of 1 nm to 100 nm.

The magnetic layer stack 100 additionally comprises a non-magnetic layer 112, referred to as a neighbor layer, and a magnetic free bi-layer 113. The non-magnetic layer 112 may be composed of a non-magnetic material such as copper, magnesium, indium, bismuth, tin, or zinc, and is disposed between the magnetic reference layer 110 and the magnetic free bi-layer 113. The magnetic free bi-layer 113 is composed of two magnetic free layers 114 and 116. Each of the magnetic free layers 114 and 116 act as a sensor layer that changes its magnetization upon an external magnetic in-plane field. The non-magnetic layer 112 is coupled directly to one of the magnetic free layers—in this case to magnetic free layer 114—without any intermediate layer in-between.

The magnetic free layers 114 and 116 are magnetically coupled to each other. In one embodiment, this coupling may be a direct coupling without any intermediate layer in-between the free layers 114 and 116. In another embodiment, the coupling may comprise an RKKY coupling with a non-magnetic layer (i.e., a coupling layer) in-between the free layers 114 and 116. Materials of the magnetic free layers can be similar to the alloys of ferromagnetic materials of the pinned layer 106 and the reference layer 110, such as CoFe, CoFeB, and/or NiFe. In particular, each magnetic free layer may be made of a material selected from cobalt, nickel, iron, and alloys thereof. Alloys may comprise non-ferromagnetic materials (e.g., carbon, boron, nitrogen, and/or oxygen) with ferromagnetic materials constituting at least 50% of a material composition of the respective layer. In this example, magnetic free layer 114 is made of CoFe and magnetic free layer 116 is made of NiFe.

Each magnetic free layer (FL) 114 and 116 can comprise a linear magnetization pattern or a closed flux magnetization pattern (e.g., a vortex magnetization pattern). Furthermore, the magnetization of each magnetic free layer 114 and 116 may follow an externally imposed magnetic field. By using two sensor layers in a bi-layer arrangement, a signal amplitude of the xMR sensor may be increased/amplified.

The magnetic layer stack 100 additionally comprises a non-magnetic layer 118, referred to as a neighbor layer, and further referred to as a matching layer. The non-magnetic layer 118 may be composed of a non-magnetic material such as copper, magnesium, indium, bismuth, tin, or zinc. This non-magnetic layer 118 is disposed on the magnetic free bi-layer 113, and specifically on the magnetic free layer 116. Thus, the non-magnetic layer 118 is coupled directly to one of the magnetic free layers—in this case to magnetic free layer 116—without any intermediate layer in-between.

A cap layer 120 made of tantalum (Ta) or tantalum-nitride (TaN) is disponed on the non-magnetic layer 118 and forms the upper layer of the magnetic layer stack 100.

The material of the non-magnetic layer 118 may be selected such that its lattice constant (i.e., atomic radius) is more closely matched to the lattice constant of the magnetic free layer 116 than the cap layer 120. For example, the non-magnetic material of the matching layer 118 may an atomic radius between an atomic radius of the magnetic free layer 116 and an atomic radius of the cap layer 120. Additionally or alternatively, the non-magnetic material of the matching layer 118 may be selected such that it has an atomic radius within 10% of an atomic radius of the magnetic free layer 116. More specifically, the non-magnetic material of the matching layer 118 may be selected such that it has an atomic radius within 5% of an atomic radius of the magnetic free layer 116. The atomic radius of the non-magnetic material of the matching layer 118 may be similarly within a specified range (e.g., 5% or 10%) from the magnetic free layer 114.

Similarly, the material of the non-magnetic layer 112 may be selected such that its lattice constant (i.e., atomic radius) is closely matched to the lattice constant of the magnetic free layer 114. For example, the non-magnetic material of the non-magnetic layer 112 may be selected such that it has an atomic radius within 10% of an atomic radius of the magnetic free layer 114. More specifically, the non-magnetic material of the non-magnetic layer 112 may be selected such that it has an atomic radius within 5% of an atomic radius of the magnetic free layer 114. The atomic radius of the non-magnetic material of the non-magnetic layer 112 may be similarly within a specified range (e.g., 5% or 10%) from the magnetic free layer 116.

By this arrangement, the lattice mismatch of the free layers 114 and 116 to the neighbouring layers 112 and 118 is minimized. Therefore, the stress/strain sensitivity is reduced.

According to some embodiments, the non-magnetic layer 112 may be electrically conducting (e.g., comprise copper, silver, gold, tungsten, aluminum, and/or alloys thereof). In this case, the magnetoresistive sensor comprising the magnetic layer stack 100 can be a GMR sensor. Alternatively, the non-magnetic layer 112 may be an electrically insulating tunnel barrier layer (e.g., made of aluminium-oxide (Al2O3) and/or magnesium-oxide (MgO)). The magnetoresistive sensor comprising the magnetic layer stack 100 may then be a TMR sensor. Thus, examples of xMR sensors of the present disclosure may comprise the magnetic layer stack 100 of FIG. 1 and/or similar magnetic layer stacks. Magnetoresistive sensors are not limited to the GMR or the TMR effect. Other examples of the present disclosure can comprise structures based on other xMR effects. The magnetic layer stack 100 may correspond to a magnetoresistor as employed by at least some embodiments of this disclosure.

As noted above, the FIG. 1 shows a vertical cross section of a first possible stack implementation: the so-called "bottom-pinned spin-valve" structure (BSV), which comprises a NAF layer 104 on the bottom (e.g., substrate) side.

Figure 2:
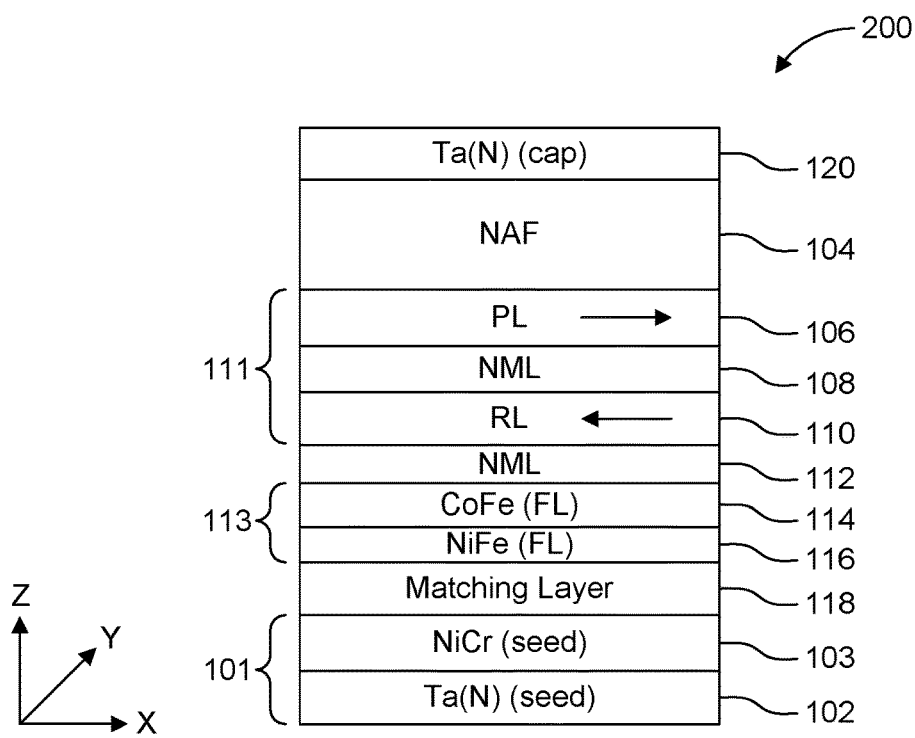
FIG. 2 shows a vertical cross-section of another GMR stack according to one or more embodiments.

FIG. 2 shows a different build-up of the magnetic layer stack 200 of the magnetoresistive sensor, where firstly the non-magnetic layer 118 (i.e., the matching layer) is deposited (on a substrate) and after that the remaining stack is deposited. In this case the stack is called "top-pinned spin-valve" (TSV), since the reference system 111 is on the top portion of the stack. The NAF layer 104 is also on the top side of the stack (i.e., deposited on top of the reference system 111).

The order of layers of the magnetic layer stack 200 is essentially reverse to the magnetic layer stack 100 shown in FIG. 1, with the exception of the seed layer 102 and the cap layer 120, which are similarly disposed in both arrangements. In addition, a seed layer 101 in FIG. 2 includes a bi-layer arrangement to two seed layers or two sub-seed layers 102 and 103, where seed layer 102 is made of Ta or TaN, and the seed layer 103 is made of nickel-chromium (NiCr) having an atomic radius of 166 pm.

In the case of using a bi-layer arrangement for the seed layer 102, for a TSV configuration, the matching layer 118 is disposed on the seed layer 103. The matching layer 118 may have an atomic radius between the atomic radius of the seed layer 103 and the atomic radius of the magnetic free layer 116, and/or may be within a predetermined range of the atomic radius of the magnetic free layer 116 (e.g., within 5 or 10%).

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A top-pinned spin-valve (TSV) magnetoresistive sensor, comprising:
    a first non-magnetic layer;
    a second non-magnetic layer;
    a magnetic free bi-layer disposed between the first non-magnetic layer and the second non-magnetic layer, the magnetic free bi-layer comprising a first magnetic free layer coupled to a second magnetic free layer;
    a first lattice-mismatched layer, wherein the second non-magnetic layer is interposed between the first lattice-mismatched layer and the second magnetic free layer,
    wherein the first magnetic free layer is coupled to the first non-magnetic layer, and the second magnetic free layer is coupled to the second non-magnetic layer, and
    the second non-magnetic layer comprises a non-magnetic material having an atomic radius within 5% of an atomic radius of at least one of the first magnetic free layer and the second magnetic free layer in order to reduce a lattice mismatch of the second magnetic free layer with the first lattice-mismatched layer,
    a seed layer;
    a cap layer; and
    a TSV magnetic layer stack disposed between the seed layer and the cap layer, the TSV magnetic layer stack including the first non-magnetic layer, the second non-magnetic layer, and the magnetic free bi-layer,
    wherein the second non-magnetic layer is disposed between and in direct contact with both the magnetic free bi-layer and the seed layer.

2. The TSV magnetoresistive sensor of claim 1, wherein the first magnetic free layer and the second magnetic free layer are each made of a material selected from cobalt, nickel, iron, and alloys thereof.

3. The TSV magnetoresistive sensor of claim 1, wherein the first magnetic free layer is made of cobalt-iron (CoFe) and the second magnetic free layer is made of nickel-iron (NiFe).

4. The TSV magnetoresistive sensor of claim 1, wherein the TSV magnetic layer stack further comprises:
   a magnetic reference system including a pinned layer and a reference layer, the magnetic reference system coupled to the first non-magnetic layer.

5. The TSV magnetoresistive sensor of claim 4, wherein the reference layer is coupled to the first non-magnetic layer.

6. The TSV magnetoresistive sensor of claim 1, wherein the first magnetic free layer is made of cobalt-iron (CoFe) and the second magnetic free layer is made of nickel-iron (NiFe).

7. The TSV magnetoresistive sensor of claim 1, further comprising:
   a magnetic reference system including a pinned layer and a reference layer, the magnetic reference system coupled to the first non-magnetic layer.

8. The TSV magnetoresistive sensor of claim 1, wherein:
   the first non-magnetic layer comprises a non-magnetic material having an atomic radius within 5% of an atomic radius of at least one of the first magnetic free layer and the second magnetic free layer in order to reduce a lattice mismatch of at least the first magnetic free layer with a second lattice-mismatched layer,
   wherein the first non-magnetic layer is interposed between the second lattice-mismatched layer and the first magnetic free layer.

9. The TSV magnetoresistive sensor of claim 1, wherein:
   the non-magnetic material of the second non-magnetic layer has an atomic radius within 5% of the atomic radius of the first magnetic free layer and the second magnetic free layer in order to reduce the lattice mismatch of the second magnetic free layer with its neighboring layer and in order to reduce a lattice mismatch of the first magnetic free layer and the first lattice-mismatched layer.

10. The TSV magnetoresistive sensor of claim 9, wherein the non-magnetic material of the first non-magnetic layer has an atomic radius within 5% of the atomic radius of the first magnetic free layer and the second magnetic free layer in order to reduce a lattice mismatch of the first magnetic free layer with its neighboring layer and in order to reduce a lattice mismatch of the second magnetic free layer and a second lattice-mismatched layer,
   wherein the first non-magnetic layer is interposed between the second lattice-mismatched layer and the first magnetic free layer.

11. The TSV magnetoresistive sensor of claim 10, wherein the first non-magnetic layer has a thickness different from a thickness of the second non-magnetic layer.

12. The TSV magnetoresistive sensor of claim 1, wherein the first magnetic free layer and the second magnetic free layer are each configured change a magnetization direction thereof based on a magnetic field impinging thereon.

13. The TSV magnetoresistive sensor of claim 1, wherein the non-magnetic material of the second non-magnetic layer is selected from one of copper, magnesium, indium, bismuth, tin, and zinc.

14. The TSV magnetoresistive sensor of claim 13, wherein the first non-magnetic layer comprises a non-magnetic material selected from one of copper, magnesium, indium, bismuth, tin, and zinc.

15. A top-pinned spin-valve (TSV) magnetoresistive sensor, comprising:
   a seed layer;
   a cap layer; and
   a TSV magnetic layer stack disposed between the seed layer and the cap layer, the TSV magnetic layer stack comprising:
      a first non-magnetic layer;
      a second non-magnetic layer; and
      a magnetic free bi-layer disposed between first non-magnetic layer and the second non-magnetic layer, the magnetic free bi-layer comprising a first magnetic free layer coupled to a second magnetic free layer, wherein the first magnetic free layer is coupled to the first non-magnetic layer, and the second magnetic free layer is coupled to the second non-magnetic layer,
   wherein the second non-magnetic layer is disposed between and in direct contact with both the magnetic free bi-layer and the seed layer, and
   wherein the second non-magnetic layer comprises a non-magnetic material having an atomic radius between an atomic radius of the second magnetic free layer and an atomic radius of at least one of the seed layer and the cap layer in order to reduce a lattice mismatch of the second magnetic free layer and the seed layer or in order to reduce a lattice mismatch of the second magnetic free layer and the cap layer.

16. The TSV magnetoresistive sensor of claim 15, wherein:
   the seed layer is composed of two sub-layers including a first sub-layer composed of nickel-chromium (NiCr) and a second sub-layer of tantalum,
   the cap layer is composed of tantalum,
   the first magnetic free layer is made of cobalt-iron (CoFe), and
   the second magnetic free layer is made of nickel-iron (NiFe).

17. The TSV magnetoresistive sensor of claim 15, wherein:
   the non-magnetic material of the first non-magnetic layer is selected from one of copper, magnesium, indium, bismuth, tin, and zinc, and
   the second non-magnetic layer comprises a non-magnetic material selected from one of copper, magnesium, indium, bismuth, tin, and zinc.

* * * * *